United States Patent
Calzaferri et al.

(10) Patent No.: US 8,917,969 B2
(45) Date of Patent: Dec. 23, 2014

(54) LUMINESCENCE CONCENTRATORS AND LUMINESCENCE DISPERSERS ON THE BASIS OF ORIENTED DYE ZEOLITE ANTENNAS

(75) Inventors: Gion Calzaferri, Bremgarten (CH); Andreas Kunzmann, Staufen (CH); Dominik Brühwiler, Zürich (CH); Christophe Bauer, Zürich (CH)

(73) Assignees: Andreas Kunzmann, Stanfen (CH); Gion Calzaferri, Bremgarten (CH); Universität Zürich, Zürich (CH)

( * ) Notice: Subject to any disclaimer, the term of this patent is extended or adjusted under 35 U.S.C. 154(b) by 509 days.

(21) Appl. No.: 12/999,013

(22) PCT Filed: Mar. 31, 2009

(86) PCT No.: PCT/CH2009/000074
§ 371 (c)(1),
(2), (4) Date: Dec. 14, 2010

(87) PCT Pub. No.: WO2010/009560
PCT Pub. Date: Jan. 28, 2010

(65) Prior Publication Data
US 2011/0094566 A1 Apr. 28, 2011

(30) Foreign Application Priority Data
Jul. 1, 2008 (CH) ......................... 1016/08

(51) Int. Cl.
*G02B 6/00* (2006.01)
*C09K 11/06* (2006.01)
(Continued)

(52) U.S. Cl.
CPC .............. *C09K 11/06* (2013.01); *Y02E 10/549* (2013.01); *Y02E 10/52* (2013.01); *F24J 2/065* (2013.01); *H01L 31/02322* (2013.01); *H01L 51/447* (2013.01); *H01L 31/055* (2013.01)

USPC .......................................... 385/141

(58) Field of Classification Search
CPC ......................... H01L 31/02322; H01L 51/447
See application file for complete search history.

(56) References Cited

U.S. PATENT DOCUMENTS
2008/0213535 A1 * 9/2008 Calzaferri et al. ............ 428/137

FOREIGN PATENT DOCUMENTS
EP 1873202 1/2008
WO 2007/012216 2/2007

OTHER PUBLICATIONS
C. Yao, H.-B. Kraatz, R. P. Steer, Photochem. Photobiol. Sci. 2005, 4, 191-199.
(Continued)

*Primary Examiner* — Uyen Chau N Le
*Assistant Examiner* — Chris Chu
(74) *Attorney, Agent, or Firm* — Shoemaker and Mattare

(57) ABSTRACT

A luminescence concentrator (LK) may concentrate both incident direct and diffuse light by way of frequency shift and total internal reflection. It differs fundamentally from geometric concentrators. With sufficient geometric expansion of the collector plate, nearly arbitrarily high concentration can be achieved in the LK. A luminescence disperser is an apparatus which holds both directional and nondirectional incident light captive in a transparent body by way of frequency shift and total internal reflection and emits it diffusely or directionally uniformly distributed across an area by way of luminescence emission. The object of the invention is a method for the technical implementation of the LK and luminescence disperser, using zeolite crystals having a nanotube structure, into which the luminescent dyes are embedded such that they have antenna properties. Using the resulting novel structures, problems can be solved which made the technical use of LK impossible or at least considerably limited it. This results in completely novel usage possibilities for collecting and concentrating sun light and feeding it into photovoltaic systems, for converting it into electric and thermal energy in combined photovoltaic/hot water apparatuses, and for feeding it into fiber optic apparatuses.

13 Claims, 6 Drawing Sheets

(51) Int. Cl.
  *H01L 31/0232* (2014.01)
  *H01L 51/44* (2006.01)
  *H01L 31/055* (2014.01)
  *F24J 2/06* (2006.01)

(56) References Cited

OTHER PUBLICATIONS

A. Musa, B. Sridharan, H. Lee, D. Lewiss Mattern, J. Org. Chern. 1996, 61, 5481-5484.
D. M. Connor, S. D. Allen, D. M. Collard, C. L. Liotta, D. A. Schiraldi, J. argo Chem. 1999, 64, 6888-6890.
A.R. Horrocks, F. Wilkinson, Froe. Rpy. Soc. A. 306, 1968, 257-273.
R. A. Garwin, Rev. Sci. Instr. 1960, 31, 1010.
W. H. Weber, J. Lambe, Appl. Opt. 1976, 15, 2299.
A. Goetzberger, W. Greubel, Appl. Phys. 1977, 14, 123.
J. S. Batchelder, A. H. Zewail, T. Cole, Appl. Opt. 1979, 18, 3090.
J. S. Batchelder, A. H. Zewail, T. Cole, Appl. Opt. 1981, 20, 3733.
P. Kittidachachan, L. Danos, T.J.J. Meyer, N. Alderman, T. Markvart, Chimia, 2007, 61, 780.
G. Calzaferri, CHIMIA 52 (1998) 525-532.
G. Calzaferri, D. Bruhwiler, S. Megelski, M. Pfenniger, M. Pauchard, B. Hennessy, H. Maas, A. Devaux, U. Graf, Solid State Sciences 2 (2000) 421-447.
G. Calzaferri, K. Lutkouskaya, Photochem. Photobiol. Sci., 2008, 7, 879-910.
Dye modified nanochannel materials for photoelectronic and optical devices, G. Calzaferri, H. Li, D. Bruhwiler, Chem. Eur. J., 2008, 14, 7442-7449.
Transparent Zeolite-Polymer Hybrid Materials with Tunable Properties, S. Suarez, A. Devaux, J. Bafinuelos, O. Bossart, A. Kunzmann, G. Calzaferri, Adv. Fund. Mater. 17, 2007, 2298-2306.
Host-Guest Antenna Materials, Gion Calzaferri, Stefan Huber, Huub Maas, Claudia Minkowski, Angew. Chem. Int. Ed. 2003, 42, 3732-3758.
Fabrication of oriented zeolite L monolayers employing luminescent perylenediimide-bridged Si(OEt)3 precursor as the covalent linker, H. Li, Y. Wang, W. Zhang, B. Liu, G. Calzaferri, Chem. Commun. 2007, 2853-2854.
Fabrication of oriented zeolite L monolayer via covalent molecular linkers, Y. Wang, H. Li, B. Liu, Q. Gan, Q. Dong, G. Calzaferri, Z. Sun, J. Solid State Chemistry, 2008, 181, 2469-2472.
Organisation and Solubilisation of Zeolite L Crystals, Olivia Bossart and Gion Calzaferri, Chimia 2006, 60, 179-181.
Surface Organometallic Chemistry at Periodic Mesoporous Silica, R. Anwander, Chern. Mater. 2001, 13, 4419-4438.
K. Asian, I. Gryczynski, J. Malicka, E. Matveeva, J. R. <Lakowicz, C. D. Geddes, Curro Opin. Biotechnol. 16, 2005, 55.
Luminescence properties of nanozeolite L grafted with terbium organic complex, Y. Wang, H. Li, W. Zhang, B. Liu, Materials Letters, 2008, 62, 3167-3170.
Highly Luminescent Host-Guest Systems Based on Zeolite L and Lanthanide Complexes, Y. Wang, Z. Guo, H. Li, J. Rare Earth, 2007, 25, 283-285.
Sensitized near infrared emission from lanthanideexchanged zeolites, A. Monguzzi, G. Macchi, F. Meinardi, R. Tubino, M. Burger, G. Calzaferri, Appl. Phys. Lett. 92, 2008, 123301/1-123301/3.
Cell-Permeant Cytoplasmic Blue Fluorophores Optimized for In Vivo Two-Photon Microscopy With Low-Power Excitation, A. Hayek, A. Grichine, T. Huault, C. Ricard, F. Bolze, B. Van Der Sanden, J.-C. Vial, Y. Mely, A. Duperray, P. L. Baldeck, J.-F. Nicoud, Microscopy Research and Technique 70, 2007, 880-885.
Brühwiler et al., "Nanochannel Materials for Quantum Solar Energy Conversion Devices", Chimia, vol. 61, No. 12, 2007, pp. 820-822, X0001536989.
Koeppe et al., "Advanced photon-harvesting concepts for low-energy gap organic solar cells", Solar Energy Materials and Solar Cells, vol. 91, No. 11, Apr. 26, 2007, pp. 986-995, XP022047682.
Koeppe et al., "Enhancing photon harvesting in organic solar cells with luminescent concentrators", Applied Physics Letters, vol. 90, No. 18, May 4, 2007, pp. 181126-1-181126-3, xp012094469.
Ruiz et al., "Organizing Supramolecular Functional Dye-Zeolite Crystals", Angewandte Chemie, International Edition, Wiley VCH Verlag, Weinheim, vol. 45, No. 32, Aug. 4, 2006, pp. 5282-5287, XP002411537.

* cited by examiner

Examples of ligands:

R = H, alkyl
R' = NH₂, COOR

| Name/abbreviation | Structural formula | Name/abbreviation | Structural formula |
|---|---|---|---|
| Proflavine* | | AY | |
| Py* | | AQ | |
| PyGY* | | MV²⁻ | |
| PyB⁺ | | BDP⁺ | |
| Ox⁺ | | MC⁺ | |
| DEOx⁺ | | PC20⁺ | |
| Ox1⁺ | | PC21⁺ | |
| Th⁺ | | BTMPI⁺ | |
| ResH | | DSM⁺ (n=1) | |
| MeAcr⁺ | | SQ III, R = CH₃<br>SQ(JG9), R = (CH₂)₇CH₃ | |

Figure 12

| Name/abbreviation | Structural formula | Name/abbreviation | Structural formula |
|---|---|---|---|
| BP | | Naphtalene | |
| pTP | | Anthracene | |
| DPH | | ResH | |
| PBOX | | N-Ethylcarbazole | |
| MBOXE | | Fluorenone | |
| POPOP | | DCS | |
| DMPOPOP | | Stilbene | |
| Isoviolanthron | | Azobenzene | |
| Solvent Green 5 | | DANS | |
| PR 149, -R= | | NY43 | |
| DXP, -R= | | JCG65 | |
| Perylene-73, -R= | | Hostasol Red | |
| | | Hostasol Yellow | |

Figure 13

LUMINESCENCE CONCENTRATORS AND LUMINESCENCE DISPERSERS ON THE BASIS OF ORIENTED DYE ZEOLITE ANTENNAS

TECHNICAL FIELD

The subject of the invention is a device for concentrating as a luminescence concentrator or for dispersing as a luminescence disperser as claimed in claim 1, a process for production thereof as claimed in claim 4 and use thereof as claimed in claims 5, 6, 7, 8, 9, 10, 11, 12, 13.

STATE OF THE ART

A luminescence concentrator, which we abbreviate to LC hereinafter, is a device which can concentrate both incident direct and diffuse light by frequency shifting and total internal reflection; see FIG. 1. These concentration processes differ fundamentally from geometric concentrators. There is no limitation by Liouville's theorem, according to which the product of photon flux density and divergence of radiative flux always remains constant in a geometric concentrator. Given sufficient geometric dimensions of the collector plate, it is possible in principle in the LC to achieve an almost unlimited concentration; on this subject, see, for example, R. A. Garwin, Rev. Sci. Instr. 1960, 31, 1010; A. Goetzberger and V. Wittwer. Sonnenenergie, Teubner Studienbücher Physik, ISBN 3-519-03081-0, Verlag Teubner 1986; W. H. Weber, J. Lambe, *Appl. Opt.* 1976, 15, 2299; A. Goetzberger, W. Greubel, *Appl. Phys.* 1977, 14, 123; J. S. Batchelder, A. H. Zewail, T. Cole, *Appl. Opt.* 1979, 18, 3090; J. S. Batchelder, A. H. Zewail, T. Cole, *Appl. Opt.* 1981, 20, 3733; R. Koeppe, N. Sariciftci, A. Büchtemann, Appl. Phys. Lett. 90 (2007) 181126; P. Kittidachachan, L. Danos, T. J. J. Meyer, N. Alderman, T. Markvart, *Chimia,* 2007, 61, 780.

An inverted luminescence concentrator, which we abbreviate to iLC hereinafter, is a device which traps both directed and undirected incident light by frequency shifting and total internal reflection in a transparent body (for example glass or plastic) and emits it, i.e. couples it out of the body, in a diffuse or directed manner in homogeneous distribution over a surface by means of luminescent emission. An iLC can thus function as a luminescence disperser.

The significant problems with the LCs now known are: (A) the loss which occurs as early as the first emission because total internal reflection is limited by half the cylinder opening angle; (B) intrinsic absorption with subsequent re-emission, which in turn results in the same loss as (A), and which additionally proceeds with a yield of a little less than 100%; (C) the necessity to distribute (dissolve) the chromophores within a relatively thick layer of several millimeters, which means a considerable restriction for the optimization of the optical properties of the LC, and more particularly makes it impossible or at least considerably more difficult to build up materials of different refractive index in a structured manner; (D) the stability of the dyes which are generally dissolved in a polymer and are thus also exposed to plasticizers and other reactive species and can even migrate in the case of considerable temperature variations. These are problems which considerably limit or even put into question the efficiency, lifetime and flexibility—in the building of arrangements, functional units or apparatuses—and hence the range of use or even the usability of LCs; see the references given above.

The significant problem with the uses now known, based on light scattering, is homogeneous light emission over a relatively large area, i.e. homogeneously distributing the light emission intensity over an area. This is required, for example, for background illumination in LCDs. Background illumination is used for backlighting of LC displays (LCDs) of electronic units. Examples are digital instruments, cellphones or flat visual display units of televisions and monitors. In LCDs, this achieves an increase in contrast compared to the non-self-illuminating, purely reflective mode of operation. The purpose of background illumination is to illuminate the visual display unit from the rear, in a flat, homogeneous and efficient manner. The color of the light source must be white in the case of color visual display units (the individual color pixels of the LCDs allow the particular color thereof to pass through), whereas it may be selected as desired in monochrome displays. The light source must not flicker in order to prevent superimpositions or beats with the actuation of the display elements or pixels.

The light-emitting diodes are still very expensive as light sources in relation to their lighting intensity. They are used for background illumination in particular where their advantages—high efficiency, long lifetime, robustness and small dimensions—are particularly beneficial. A typical example is that of visual display units for small mobile units such as cellphones or navigation systems. LCD televisions equipped with LEDs are commercially available, but have to date (2008) not achieved wide acceptance. The most frequently used inexpensive light sources are luminophore tubes (in the case of large displays, usually cold cathode tubes). The UV radiation thereof is blocked by use of specific tube glass in order not to damage the surrounding plastic. Cold cathode tubes can be found in virtually all laptops, monitors, LCD televisions and some PDAs.

Light sources which appear particularly suitable for use as background illumination are those which are fundamentally flat radiators, because this significantly reduces the demands on the guiding of light. Since as early as about 1950 there have been electroluminescent films which are extremely flat with thicknesses of less than 1 mm. The efficiency, the lifetime and the achievable luminance of electroluminescent films are, however, such that use in monitors or televisions is impossible. Also implementable as flat radiators are xenon low-pressure lamps with dielectric hindrance of discharge (e.g. Planon from OSRAM) and organic light-emitting diodes (OLEDs). These could become commercially successful within a few years as soon as the efficiency and the lifetime meet market demands. Incandescent lamps are no longer used for backlighting.

The light emitted from point or linear light sources must be distributed very substantially homogeneously over the area of the background illumination. This is referred to as light guiding. In the case of relatively weak background illumination, the light is usually fed to the ends of a light conductor. In practise, the light conductor is a flat sheet of a transparent plastic, for instance acrylic glass. This contains extractors which emit the light from the light conductor. The emission can be achieved by scattering structures distributed in the light conductor material, by specific fine surface structures, or by fine printed patterns. The inhomogeneous distribution of the emitting structures has the effect that the homogeneous illumination of the surface is also achieved, for example, with only one cold cathode tube incident at the end. To increase the luminance, the light sources may, however, be mounted at two or all four end faces. Background illumination according to this principle is referred to as "edge-lit backlighting". With increasing size of the light source (and constant side ratio, e.g. 16:9), the sum of the side lengths increases only proportionally to the length of one side, but the area increases as the square. Since the power or the efficiency of the light sources cannot be enhanced to an unlimited degree, the "edge-lit backlights" are fundamentally limited here. For larger formats, constructions derived from the known light boxes are therefore being used. The light sources in this case are in a flat trough which reflects the light diffusely in the interior thereof and only allows it to leave toward the open side. Specially shaped reflectors are often used for luminophore lamps, and diffuser lenses for LEDs, in order that the light exiting from the light trough is approximately homogeneous in spite of a small installation depth of the background illumination.

The light distributed by the light conductor or the light trough possibly still has a spatial structure and has to be distributed homogeneously with the aid of a diffuser in order that it approximates to an absolutely homogeneously white-illuminating surface. A simple solution is an opalescent scattering sheet between light conductor or light trough and LC visual display unit. It is usual, however, to use films which homogenize the light more efficiently than is possible with opalescent glass. 3M, for example, has developed the Vikuiti films which better exploit the light by a factor of two compared to an opalescent diffuser. These films reflect all that light which is unsuitable for the backlighting of the LCD in respect of direction and polarization back to the light conductor. This light is scattered within the light conductor, mixed in terms of direction and polarization, and goes back in the direction of the LCD. Similarly to a geometric series, the operation is repeated and leads to better exploitation of the light.

Especially the emission of the light from a light-conducting material is nowadays realized with solutions for diffuse light scattering. This can be achieved by means of scattering structures which are distributed in the light conductor material, by means of specific fine surface structures or by means of fine printed patterns. To solve this problem, according to the present state of the art, diffuse light scattering at rough surfaces is thus employed, or a flat radiator is used (e.g. luminophore tubes). These methods prevent the possibility of implementing the illuminated surface transparently and as a homogeneous light radiator; problem (E).

This problem (E) is solved by, instead of emission by scattering, effecting emission by means of luminescence using an iLC, since this can be made transparent. With the aid of the iLC presented here, principles analogous to those for the luminescence concentrator (LC) apply.

Over the course of several years, we have developed processes which allow the construction of luminescent materials with considerable optically anisotropic properties, in which radiationless energy transfer from donor molecules to acceptors, which then emit the light again as the luminescence, can be finely adjusted such that a varied spectrum of interesting properties is developed. Review articles which also illustrate the development of this work are: G. Calzaferri, *CHIMIA* 52 (1998) 525-532; G. Calzaferri, D. Brühwiler, S. Megelski, M. Pfenniger, M. Pauchard, B. Hennessy, H. Maas, A. Devaux, U. Graf, *Solid State Sciences* 2 (2000) 421-447; G. Calzaferri, S. Huber, H. Maas, C. Minkowski *Angew. Chem. Int. Ed.* 42, 2003, 3732-3758; G. Calzaferri, K. Lutkouskaya, *Photochem. Photobiol. Sci.*, 2008, 7, 879-910.

We have already made earlier proposals that it would be worth using the dye-zeolite materials that we developed for LCs; on this subject see, for example: *Orientierte Zeolith L Kristalle auf einem Substrat*, G. Calzaferri, A. Zabala Ruiz, H. Li, S. Huber, Oriented zeolite material and method for producing the same, PCT/CH2006/000394; priority U.S. 60/698,480 and CH 1266/05. *Nanochannel Materials for Quantum Solar Energy Conversion Devices*, D. Brühwiler, L.-Q. Dieu, G. Calzaferri, *CHIMIA*, 61, 2007, 820-822. *Dye modified nanochannel materials for photoelectronic and optical devices*, G. Calzaferri, H. Li, D. Brühwiler, *Chem. Eur. J.*, 2008, 14, 7442-4749. In these studies, certain aspects of the new materials which could be useful for the production of LCs are discussed.

We have found, more particularly, that it is possible to bind zeolite crystals into a polymer in such a way that the light scattering caused by the zeolite crystals can be completely suppressed within the relevant longer-wave range; on this subject, see: *Transparent Zeolite-Polymer Hybrid Materials with Tunable Properties*, S. Suárez, A. Devaux, J. Bañnuelos, O. Bossart, A. Kunzmann, G. Calzaferri, *Adv. Funct. Mater.* 17, 2007, 2298-2306; *Transparent Zeolite-Polymer Hybrid Material with Tunable Properties*, G. Calzaferri, S. Suarez, A. Devaux, A. Kunzmann, H. J. Metz, PCT European Patent application EP1873202.

Important terms such as zeolite L, antenna, organized dye-zeolite materials, etc. are explained in the study published in German language: *Photon-Harvesting Host-Guest Antenna Materials (Wirt-Gast Antennenmaterialien)* Gion Calzaferri, Stefan Huber, Huub Maas, Claudia Minkowski, *Angew. Chem.* 115, 2003, 3860-3888; *Angew. Chem. Int. Ed.* 42, 2003, 3732-3758. In FIG. 2, we show a cylindrical zeolite nanocrystal with organized dye molecules, which function as donors (grey rectangles) and acceptors (black rectangles). In the left-hand part of the figure, the donors are in the middle regions and the acceptors are at the two ends of the channels; in the right-hand part, the donors are located at the ends and the acceptors in the middle part. The dye molecules which are ordered supramolecularly and organized in such a way in zeolites are formed so as to result in an antenna function, which luminescent sites are referred to as antennas. This achieves a significant shift in the luminescence to greater wavelengths. The enlargement shows details of a channel with a dye molecule whose electronic transition moment (double-headed arrow) is parallel to the channel axis in large molecules and deflected in smaller molecules. The diameter of a channel opening of zeolite L is 0.71 nm, with a greatest channel diameter of 1.26 nm. The distance from the middle of a channel to the middle of a neighboring channel is 1.84 nm.

DESCRIPTION OF THE INVENTION

The concept of the present study originated from the KTI project 9231.2 PFNM-NM (development of efficient LCs based on inorganic-organic nanomaterials for use in solar power generation). It is an object of the invention to realize the individual solutions to problems A) to D) in a new and integral manner in one device. This enables a functioning and highly efficient LC. Taking account of problem solution E), the result is even an iLC; see also claims 1 and 4. Accordingly, the invention consists in using the solutions to the abovementioned problems (A) to (E) with LCs and iLCs by refined and rigorous exploitation of all research results known to date, such that LCs and iLCs become of interest for commercial utilization. This gives rise to new uses which are described in some examples; see also claims 5 to 13.

The light-absorbing and light-transporting part consists essentially of three regions and is shown schematically in FIGS. 1, 4 and 5. (B1) A transparent glass or polymer with refractive index $n_1$ and layer or sheet thickness $x_1$, onto which the light is incident. (B2) A light-absorbing and light-emitting part, which we refer to as antenna and which works as explained in FIG. 2, consisting of one or more, generally aligned dye-zeolite layers (see FIG. 3) embedded into a transparent polymer. The thickness of the individual zeolite layers is typically in the range between 100 nm and 2000 nm. The length and thickness of the zeolite crystals used is likewise within this size range, disk-shaped crystals frequently being advantageous. The individual layers may be very tightly packed, or they may be separated via thin intermediate layers of a transparent material. The refractive index of the intermediate layers and of the polymer into which the zeolite layers are embedded is selected so as to result in optimal properties. (B3) Next follows a transparent polymer or glass with refractive index $n_2$ and layer or sheet thickness $x_2$. While the regions (B1) and (B3) meet customary requirements, are typically a few mm thick and can also be formed, for example, from two layers or sheets, for example a base body and a surface-treated layer or sheet or a glass part and a polymer part, the region (B2) is of more complex structure and constitutes the actual core piece; see FIGS. 4 and 5. FIG. 4 shows a luminescence concentrator having a dye-zeolite antenna layer. This antenna layer consists of one or more layers of aligned or unordered dye-zeolite crystals embedded in a thin polymer film, or coated with a thin polymer film. One of the two immediately adjacent layers or sheets, with thickness $x_1$ or $x_2$, can be omitted if required. The refractive indices of the adjacent layers or sheets are $n_1$ and $n_2$; $n_s$ is the refractive index of the antenna layer and $n_0$ is the refractive index of the environment (typically air). $\delta_s$ is the thickness of the antenna layer. FIG. 5 shows a two-dimensional view of an LC with two dye-zeolite antenna layers. The number of antenna layers can be increased as desired, the sum of the thicknesses of the antenna layers being much smaller than d. The antenna layers may have different structures, for example contain different dye-zeolite crystals. The designation of layer thicknesses and refractive indices is analogous to FIG. 4.

This structure solves not only the problems (A) to (C) detailed under "State of the art" but has a considerable influence on the stability of the chromophores because the donor molecules pass on the energy absorbed via near-field interaction in the sub-picosecond range, such that barely any time remains for a reaction in the electronically excited state, and because the spatial delimitation by the nanotubes results in a cage effect, thus making impossible or at least considerably hindering both intra- and intermolecular movements which could lead to reactions. More particularly, it is also possible to quantitatively exclude small reactive molecules, for instance oxygen.

The incorporation of the dyes into the zeolite L crystals is effected from the gas phase in the case of uncharged dye molecules, and from a suitable solvent in the case of cationic dyes. Dyes adsorbed on the outer zeolite crystal surface are subsequently removed by washing with a solvent. The incorporation of different dyes can be effected sequentially or in parallel. Sequential incorporation results in defined dye domains, and the positioning of the acceptor molecules in the middle of the zeolite channels may be advantageous owing to the better screening from external reactive species. For other end uses or for certain chromophores, positioning at the ends of the channels gives rise to optimal properties. The parallel incorporation of different dyes leads to mixing within the crystal. To eliminate self-absorption, irrespective of the incorporation process, a large donor/acceptor ratio is selected, which is generally greater or considerably greater than 10:1.

The application of the dye-laden zeolite crystals to a substrate (for example glass) and the coating with a transparent polymer can be implemented, for example, as follows: (1) By production of a homogeneous mixture of polymer and zeolite crystals in a suitable solvent. The mixture is applied to the substrate by spreading (e.g. doctor-blading) or spin-coating. The evaporation of the solvent gives rise to a robust zeolite-polymer layer of defined thickness. (2) By production of one or more zeolite layers (directed or unordered) on the substrate and subsequent fixing with a little polymer. After the drying, the rest of the polymer layer is applied by spreading (e.g. doctor-blading) or spin-coating. In other cases, the method as illustrated in FIG. 3 may be advantageous; on this subject see: *Organizing supramolecular functional dye-zeolite crystals*, A. Zabala Ruiz, H. Li, G. Calzaferri, Angew. Chem. Int. Ed., 2006, 45, 5282-5287; *Fabrication of oriented zeolite L monolayers employing luminescent perylenediimide-bridged Si(OEt)$_3$ precursor as the covalent linker*, H. Li, Y. Wang, W. Zhang, B. Liu, G. Calzaferri, Chem. Commun. 2007, 2853-2854; *Fabrication of oriented zeolite L monolayer via covalent molecular linkers*, Y. Wang, H. Li, B. Liu, Q. Gan, Q. Dong, G. Calzaferri, Z. Sun, J. Solid State Chemistry, 2008, 181, 2469-2472. The crystals may also be aligned similarly to a nematic phase, in which case a considerably tighter packing than that depicted in FIG. 3 (on the right) is possible. FIG. 3 shows an electron micrograph on the left and a fluorescence micrograph on the right, and originates from: *Organisation and Solubilisation of Zeolite L Crystals*, Olivia Bossart and Gion Calzaferri, Chimia 2006, 60, 179-181.

In each case, if required, a covering material (for example a glass plate or a polymer film) can be applied to the zeolite-polymer layer. The relative position of the luminescent zeolite-polymer layer is controlled by the thickness of substrate and covering material. The covering material can be covered with a further dye-zeolite layer by repetition of the above-described procedure, which allows a structure as shown in FIG. 5 to be achieved. The application of further dye-zeolite layers and intermediate layers can be repeated as often as desired, which allows defined stacks of antenna layers separated by intermediate layers.

The structure of the iLC or of a luminescence disperser (LD) (FIG. 8) is analogous to that of the LC (FIG. 1). Instead of the receiver in the LC, an emitter is installed as excitation light (e.g. UV). Total reflection transports the light through the light conductor. When it hits a luminescent site, consisting of a dye-zeolite crystal, the light is absorbed and emitted again. By directed arrangement of the luminescent sites (dye-zeolite crystals), the emission angle is selected such that the photon leaves the light conductor (cf. FIG. 1, exiting light flux). The body is transparent to wavelengths which enter the body and are not absorbed by the luminescent sites (dye-zeolite crystals). By virtue of the concentration distribution as a function of the emitter distance and/or as a result of the reflection at the body sides, it is possible to achieve homogeneous surface emission out of the body (the last step partly approximates to the light boxes with diffuse reflection in the box interior and an orifice through which the light is emitted diffusely from the box). The wavelength range within which the dye-zeolite nanocrystals used emit can be selected by adjusting the donor/acceptor combination from narrow-band emission to white light (on this subject see G. Calzaferri, S. Huber, H. Maas, C. Minkowski *Angew. Chem. Int. Ed.* 42, 2003, 3732-3758; G. Calzaferri, K. Lutkouskaya, *Photochem. Photobiol. Sci.,* 2008, 7, 879-910).

BRIEF DESCRIPTION OF THE FIGURES

FIG. 12. Examples of cationic dyes which have been incorporated into zeolite L and are options for the use described here.

FIG. 13. Examples of uncharged dyes which have been incorporated into zeolite L and which are options for the use described here.

MODES FOR CARRYING OUT THE INVENTION

1. Building an LC

The incorporation of the dyes into the zeolite L crystals is effected generally from the gas phase at elevated temperature in the case of uncharged dye molecules, and from a suitable solvent in the case of cationic dyes. Dyes adsorbed on the outer zeolite crystal surface are subsequently removed by washing with a solvent. The incorporation of different dyes can be effected sequentially or in parallel. In the case of sequential incorporation, the result is defined dye domains, in which case the positioning of the acceptor molecules in the middle of the zeolite channels may be advantageous owing to the better screening from external reactive species. The parallel incorporation of different dyes leads to mixing within the crystal. To eliminate self-absorption, a large donor/acceptor ratio is selected (>10:1). Examples of dyes which have been incorporated successfully into the channels of zeolite L in this way are compiled in FIGS. 12 and 13.

Figure 1:
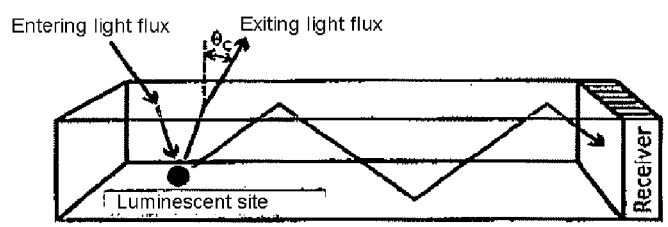
FIG. 1. Drawing of a conventional luminescence concentrator (LC).
Figure 2:
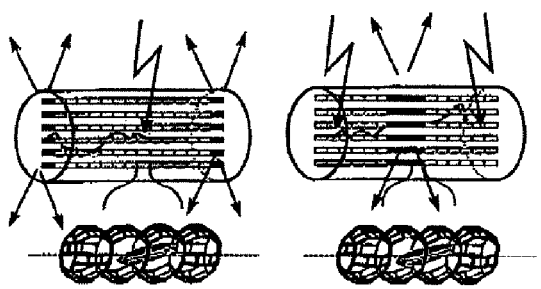
FIG. 2. Luminescent sites: cylindrical zeolite nanocrystals with organized dye molecules, which function as donors (grey rectangles) and acceptors (black rectangles).
Figure 3:
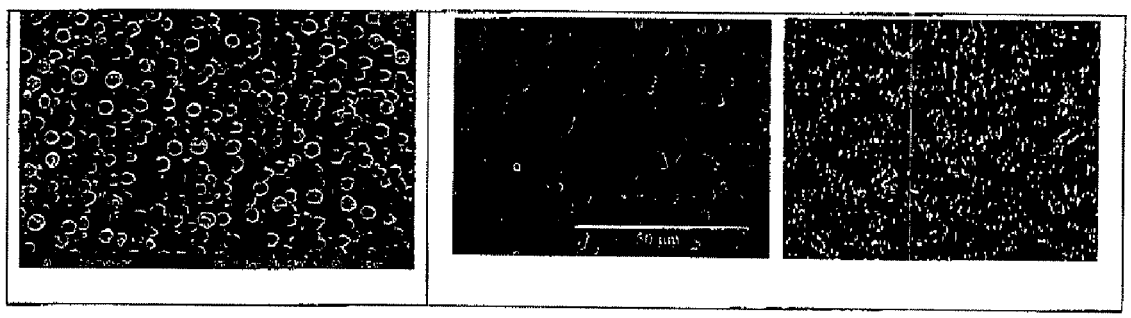
FIG. 3. Oriented zeolite layer. On the left: electron microscope image of cylindrical zeolite L crystals on a glass substrate. On the right: the crystals may also be aligned similarly to a nematic phase (electron microscope and fluorescence microscope image).

The application of the dye-laden zeolite crystals to a substrate (for example glass) and the coating with a transparent polymer (e.g. PMMA, CR39, PVA) can be implemented, for example, as follows: (1) By production of a homogeneous mixture of polymer and zeolite crystals in a suitable solvent. The mixture is applied to the substrate by spreading (e.g. doctor-blading) or spin-coating. The evaporation of the solvent gives rise to a robust zeolite-polymer layer of defined thickness. (2) By production of one or more zeolite layers (directed or unordered) on the substrate and subsequent fixing with a little amount of polymer. After drying, the rest of the polymer layer is applied by spreading (e.g. doctor-blading) or spin-coating. In other cases, the method as illustrated in FIG. 3 may be advantageous; on this subject see: *Organizing supramolecular functional dye-zeolite crystals*, A. Zabala Ruiz, H. Li, G. Calzaferri, Angew. Chem. Int. Ed., 2006, 45, 5282-5287; *Fabrication of oriented zeolite L monolayers employing luminescent perylenediimide-bridged $Si(OEt)_3$ precursor as the covalent linker*, H. Li, Y. Wang, W. Zhang, B. Liu, G. Calzaferri, Chem. Commun. 2007, 2853-2854; *Fabrication of oriented zeolite L monolayer via covalent molecular linkers*, Y. Wang, H. Li, B. Liu, Q. Gan, Q. Dong, G. Calzaferri, Z. Sun, J. Solid State Chemistry, 2008, in press. The crystals can also be aligned similarly to a nematic phase, in which case a considerably tighter packing than that depicted in FIG. 3 (to the right) is possible. FIG. 3 shows an electron micrograph on the left and a florescence micrograph on the right, and originates from: *Organisation and Solubilisation of Zeolite L Crystals*, Olivia Bossart and Gion Calzaferri, Chimia 2006, 60, 179-181.

Figure 5:
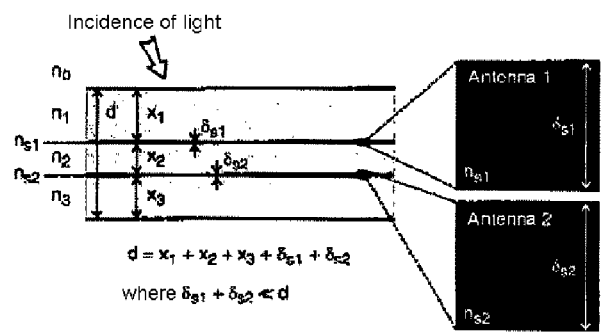
FIG. 5. Two-dimensional view of an LC with two dye-zeolite antenna layers.

In each case, if required, a covering material (for example a glass plate) can be applied to the zeolite-polymer layer. The relative position of luminescent zeolite-polymer layer is controlled by the thickness of substrate and covering material. The covering material can be covered with a further dye-zeolite layer by repeating the above-described procedure, which allows a structure as shown in FIG. 5 to be achieved. The application of further dye-zeolite layers and intermediate layers can be repeated as often as desired, which allows defined stacks of antenna layers separated by intermediate layers to be produced.

2. Production of an LC with Exploitation of Surface-enhanced Plasmon Resonance

The controlled enhancement of luminescent properties of molecules by metal nanostructures (thin layers or particles) has been known for a few years (K. Aslan, I. Gryczynski, J. Malicka, E. Matveeva, J. R. Lakowicz, C. D. Geddes, Curr. Opin. Biotechnol. 16, 2005, 55). Studies regarding potential uses have concentrated to date on the biotechnology and LED fields. Together with the novel LCs described here, this gives rise to a series of innovative options for use of metal-enhanced luminescence: disk-shaped zeolite L crystals are first laden with donor molecules. The acceptor molecules present in deficiency are incorporated subsequently and are thus at the ends of the zeolite channels. The substrate consists of a conventional carrier material (e.g. glass) which is coated with a thin metal film. Thereafter, the disk-shaped, dye-laden zeolite crystals are applied such that any direct contact between the metallic substrate and the dyes is prevented. This is accomplished by the above-described process to form an aligned layer, which results in distances in the region of a few nanometers between metal film and acceptor molecules. In the case of such distances (direct contact between dye and metal film is not required and must generally be avoided), the emission of the dyes can be enhanced significantly by excitation of surface plasmons in the metal film and the associated increase in the electromagnetic field. With regard to the efficiency and stability of an LC, this structure may bring the following advantages: (i) Shortening of the lifetime of the excited state of the acceptor molecules and hence an increase in the photostability. (ii) Increase in luminescent quantum yield of the acceptor molecules and hence higher efficiency of the LC. There is additionally the possibility of using acceptor molecules which have a low quantum yield but have other advantageous properties (stability, cost). The same effect leads to enhanced absorption, but only in the region of a few nm removed from the metal surface.

3. Building an LC Using Rare Earth Chromophores as Emitters

It is well known that rare earths $Ln^{3+}$ can be incorporated in different form into the channels of zeolite L and lead to interesting luminescent properties (*Luminescence properties of nanozeolite L grafted with terbium organic complex*, Y. Wang, H. Li, W. Zhang, B. Liu, Materials Letters, 2008, 62, 3167-3170; Highly Luminescent Host-Guest Systems Based on Zeolite L and Lanthanide Complexes, Y. Wang, Z. Guo, H. Li, J. Rare Earth, 2007, 25, 283-285; *Sensitized near infrared emission from lanthanide-exchanged zeolites*, A. Monguzzi, G. Macchi, F. Meinardi, R. Tubino, M. Burger, G. Calzaferri, Appl. Phys. Lett. 92, 2008, 123301/1-123301/3).

Figure 9:
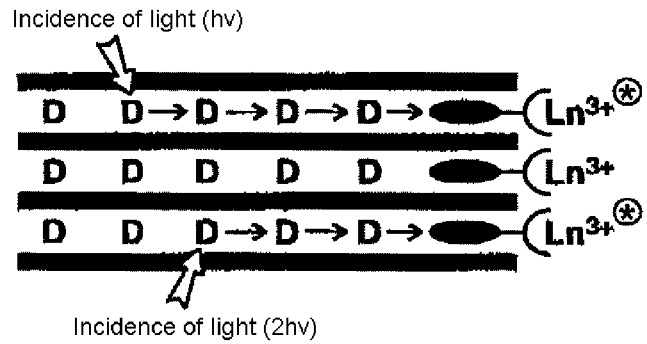
FIG. 9. LC using rare earth emitter antenna. The $Ln^{3+}$ is fixed according to: *SOMC@PMS. Surface Organometallic Chemistry at Periodic Mesoporous Silica*, R. Anwander, Chem. Mater. 2001, 13, 4419-4438.
Figure 9:
Figure 9:
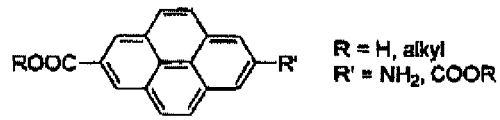
Figure 10:
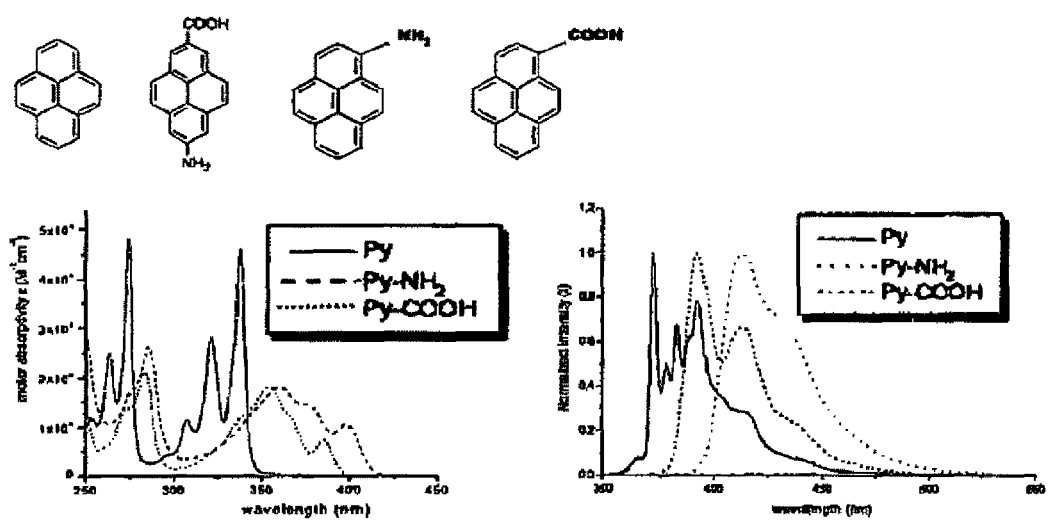
FIG. 10. Pyrene as a donor and some possible ligands, as examples (from left to right: pyrene, 2-carboxy-7-aminopyrene, 1-pyreneamine, 1-pyrenecarboxylic acid).

Here, we use a new kind of combination of an antenna hybrid material in which a rare earth ion serves as the emitter. The special feature of this combination is that the rare earth compounds—which have only comparatively low light absorption even when they are equipped with antenna ligands—can be excited by means of our antenna systems which have very high light absorption, without losing their ability to emit in a narrow band, as explained in FIGS. 9 and 10. It is also possible to use, as antenna absorbers, molecules which have markedly nonlinear optical (NLO) properties, such that it is possible to work with two-photon excitation. Two-photon excitation antennas may be of high interest for solar uses, but also for microscopy ranging as far as diagnostics; on this subject see *Cell-Permeant Cytoplasmic Blue Fluorophores Optimized for In Vivo Two-Photon Microscopy With Low-Power Excitation*, A. Hayek, A. Grichine, T. Huault, C. Ricard, F. Bolze, B. Van Der Sanden, J.-C. Vial, Y. Mely, A. Duperray, P. L. Baldeck, J.-F. Nicoud, Microscopy Research and Technique 70, 2007, 880-885. We use, among other substances, pyrene derivatives because they bring very good prerequisites for successful sensitization of $Eu^{3+}$. They have high absorption in the near UV, and have high luminescent yields and inter-system crossing; on this subject see: A. R. Horrocks, F. Wilkinson, *Proc. Rpy. Soc. A*. 306, 1968, 257-273. The coordination properties of pyrenes to lanthanide ions can be adjusted efficiently with the aid of simple synthesis (attachment of acid, ester, amide, amino groups and others). Substituents in the 2 position are notable in that the ligands fit better into the zeolite L channels. $Eu^{3+}$-pyrene complexes can thus also serve as peg molecules which have comparatively very narrow-band emission. In a donor-acceptor cascade as shown in FIG. 9, a donor-pyrene molecule (D) is electronically excited by light absorption. It then transfers its excitation energy radiationlessly via near-field interaction to neighboring molecules until it arrives at a pyrene ligand coordinated to $Eu^{3+}$. From there, an emitting state of $Eu^{3+}$ is then occupied, which somewhat later emits a long-wave photon. The corresponding ligand synthesis and coordination chemistry is well known; on this subject see D. M. Connor, S. D. Allen, D. M. Collard, C. L. Liotta, D. A. Schiraldi, *J. Org. Chem.* 1999, 64, 6888-6890; A. Musa, B. Sridharan, H. Lee, D. Lewiss Mattern, *J. Org. Chem.* 1996, 61, 5481-5484; C. Yao, H.-B. Kraatz, R. P. Steer, *Photochem. Photobiol. Sci.* 2005, 4, 191-199. The absorption and luminescence spectra of Py, $Py-NH_2$ and Py-COOH are shown in FIG. 10. It can be inferred therefrom that Py can serve very efficiently as a donor both for $Py-NH_2$ and for Py-COOH. Loading of zeolite L with subsequent installation of $Eu^{3+}$-pyrene complexes and production of LCs based on these antennas leads to LCs with spectral properties of particular interest from a performance point of view. Intrinsic absorption becomes so low here that it can be neglected completely.

4. The Principles, Routes and Methods Described for the Building of LCs Also Apply to the iLCs.

Commercial Utility

1. LCs for Collection and Concentration of Sunlight

The use of LCs is well known from the literature. With regard to the principles in conventional use, there is at first no difference between the LCs being addressed here and previously described variants. However, the central difference is that the problems with the LCs known to date, which are described under "State of the art", have been solved or at least reduced to a sufficient degree that they can now also be achieved for this use. Owing to the new way in which they are constructed, these LCs and the associated advantageous optical properties lead to a considerably better cost/benefit ratio of building-integrated photovoltaic systems and for collection and subsequent transport of light, for example in a glass fiber.

2. LCs for Tandem Solar Cell

Figure 6:
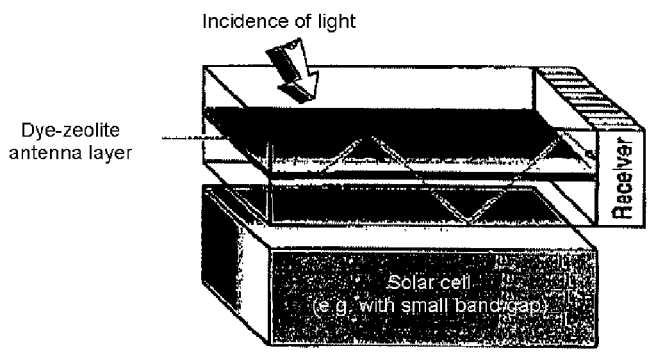
FIG. 6. Luminescence concentrator-tandem solar cell apparatus.

The principle is that light in the range from near UV up to a wavelength limit which may, for example, be 600 nm is conducted via LCs to a "large band gap" solar cell, and that a "small band gap" solar cell on the reverse side of the LC collects the long-wave portion of the light. This allows building of a tandem solar cell which does not require "current matching" and in which no complex layers are needed; see FIG. 6. This tandem arrangement allows a maximum thermodynamic efficiency of somewhat more than 43% compared to a maximum of 29% in a "single band gap" photovoltaic cell; on this subject see Peter Würfel, Physics of Solar Cells, Wiley-VCH, Weinheim, 2005.

3. Photovoltaic-hot Water Integration

Figure 7:
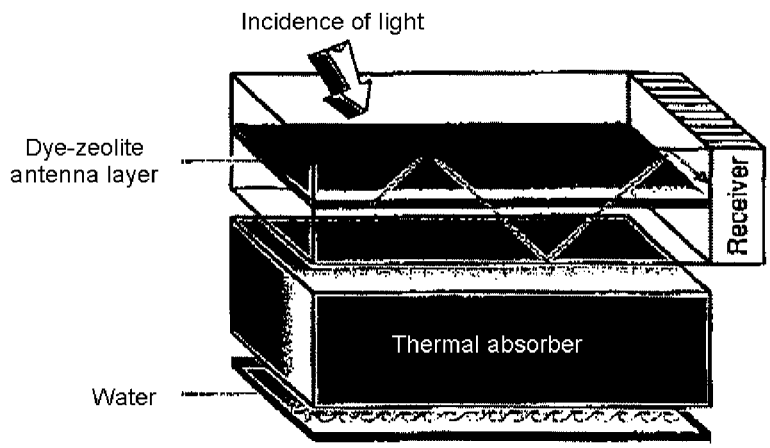
FIG. 7. Combination of luminescence concentrator-solar cell apparatus with hot water production.
Figure 8:
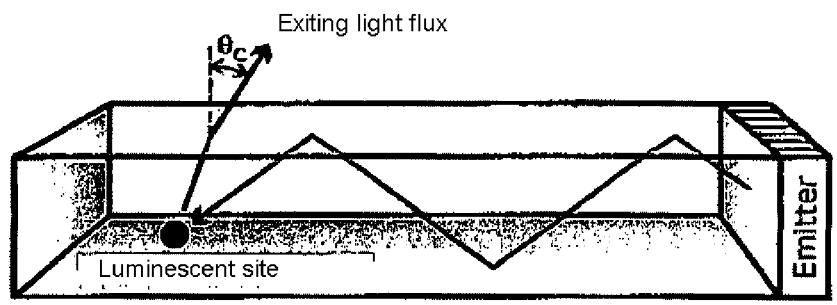
FIG. 8. Reverse utilization of LC. Instead of the receiver, an emitter is installed on the LC, and thus the LC is mutated to an iLC. The emitter emits excitation light into the luminescence disperser. The light is absorbed by the dye zeolite (luminescent site) and emitted again as luminescence. By suitable arrangement of luminescent sites, the luminescent emission can be directed such that the light leaves the light conductor.

Another possible use which becomes an option with partial LCs is the integration of photovoltaics into a hot water production system. This is an idea which is well known in principle. It consists in utilizing the long-wave portion of the incident solar radiation for hot water production and the shorter-wave portion to operate a photovoltaic cell. This has huge energetic advantages and can also contribute (in hot countries) to the cells not becoming too hot (for example by virtue of a 60° C. limit). By using the novel LC devices described here, it is possible to physically completely decouple the solar cell portion and the hot water portion, as outlined in FIG. 7, and thus to solve the problems which are a consequence of the combined large area of the two transducers (thermal and electrical) and which lead in conventional systems to hurdles which can barely be overcome in practical use. The LC is transparent to infrared radiation over wide ranges, especially in the near IR.

4. Inverted LC

The term luminescence concentrator might seem curious for this "inverted device". Owing to the analogy to the physical process, we wish nevertheless to use this name and to abbreviate it to iLC. The structure of an iLC is such that light is fed in laterally at one or more points, for example with the aid of an LED. The light is then absorbed by dye-zeolite antennas and passed on within the antenna system in an analogous manner to that in the LC until it meets a region in which it is absorbed by a second type of antenna crystals which are aligned such that the light is no longer reflected internally but leaves the layer. This can make a glass or plastic surface appear partially dark and partially as a diffuse emitter. Areas of use for such iLCs are various, and range from signaling systems, through illuminated signage, through room lighting, flat/diffuse light sources and background illumination.

One use consists in the possibility of implementing a visual display unit via a two-photon emission process. By loading the zeolites with a two-photon emission system, orthogonal incidence of the two excitation wavelengths induces one or more pixels to emission. The incident intensity of the excitation sources can be used to regulate the brightness of the individual pixels. Suitable emission wavelengths adjust the pixel color. Instead of diffuse emission, it is also possible to establish directed emission with a limited emission opening angle, in order to increase the emission intensity in the desired direction.

5. LCs Exploiting Surface-enhanced Plasmon Resonance

Figure 4:
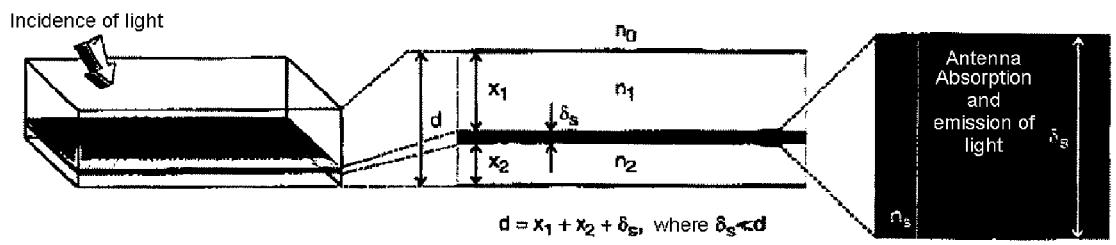
FIG. 4. Luminescence concentrator with a dye-zeolite antenna layer.

The phenomenon of surface-enhanced plasmon resonance (K. Aslan, I. Gryczynski, J. Malicka, E. Matveeva, J. R. Lakowicz, C. D. Geddes, Curr. Opin. Biotechnol. 16, 2005, 55) can be used in conjunction with the structure shown in FIG. 4 in an ideal manner to optimize the luminescent properties of the dyes. A thin metal layer adjoining the antenna layer leads to an enhancement of luminescence by molecules close to the interface between antenna layer and metal layer. The use of an antenna layer consisting of oriented zeolite L crystals (channels at right angles to the surface of the metal film) allows the distance of the metal surface from the acceptor or donor molecules to be controlled. This avoids direct contact between the dye molecules and the metal surface. In a conventional LC (consisting of dye molecules in a polymer layer) and in all other LC designs known to date, such an optimization of luminescent properties is not possible. In the concept that we have developed, use of surface-enhanced plasmon resonance is of particular interest for optimization of luminescent properties of the acceptor molecules.

6. LCs Using Rare Earth Chromophores as Emitters

Here we propose a new combination of an antenna hybrid material, in which a rare earth ion serves as an emitter. The special feature of this combination is that the rare earth compounds—which have only comparatively low light absorption even when they are equipped with antenna ligands—can be excited by means of our antenna systems which have very high light absorption without losing their ability to emit in a narrow band, as explained in FIGS. 9 and 10. (The spectra shown in FIG. 10 have been taken from the literature: C. Yao, H.-B. Kraatz, R. P. Steer, *Photochem. Photobiol. Sci.* 2005, 4, 191-199.) The antenna absorbers used may also be molecules which have marked NLO properties, such that it is possible to work with two-photon excitation. Two-photon excitation antennas may be of high interest for use in solar technology, but also for microscopy ranging as far as diagnostics (*Cell-Permeant Cytoplasmic Blue Fluorophores Optimized for In Vivo Two-Photon Microscopy With Low-Power Excitation*, A. Hayek, A. Grichine, T. Huault, C. Ricard, F. Bolze, B. Van Der Sanden, J.-C. Vial, Y. Mely, A. Duperray, P. L. Baldeck, J.-F. Nicoud, Microscopy Research and Technique 70, 2007, 880-885).

7. LC Device for Use as a Scintillation Detector

DMPOPOP and other highly fluorescent dyes which are used in scintillation counters for the measurement of ionizing radiation, for instance gamma quanta, can be incorporated into zeolite L in very high concentration, up to about 0.2 mol/l. They can pass on their electronic excitation energy to acceptors. For DMPOPOP, for example, it is possible to use PR149, DXP or oxonine as acceptors. With the aid of such dye-zeolite L materials, it is possible to build LCs as described in 1. to 3. and in FIGS. 4 and 5. Such LCs are rendered reflective on the open sides and installed at a site in the detector. It is thus also possible to collect extremely sensitively ionizing radiation over a large area and convert it to luminescence of the scintillator dye. This is transferred via energy transfer to the acceptor, which then emits at a long wavelength. Via total internal reflection, the luminescence to be measured is transferred to the detector. It is particularly simple and inexpensive in such a device to protect the detector from incident ionizing radiation.

8. iLCs for Locally Directed Emission

Figure 11:
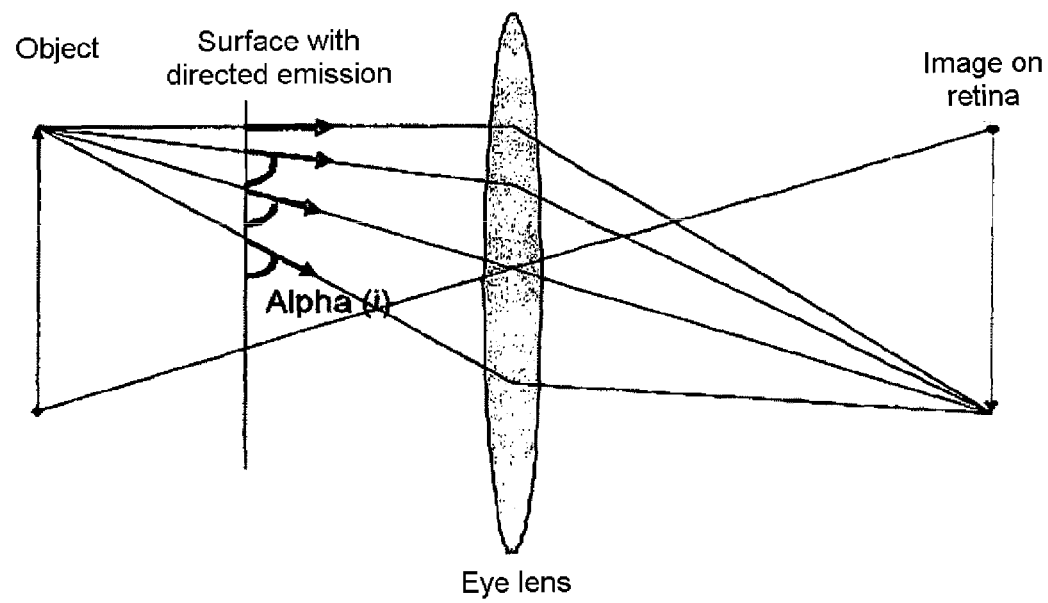
FIG. 11. This diagram shows how an image can be projected onto the retina of the viewer (eye lens) instead of an object with the aid of a surface with directed emission. Individual image elements on the surface emit photons at the spatial emission angle alpha. The emission angle of the individual image point determines which pixel of the image to be projected has to be emitted by this image point.

Oriented dye-zeolite antennas allow the achievement of directed emission (on this subject see especially G. Calzaferri, K. Lutkouskaya, Photochem. Photobiol. Sci., 2008, 7, 879-910). Instead of the viewing of a visual display unit, it is thus possible to directly project images onto the retina of the eye, without external optical elements. This is illustrated schematically in FIG. 11: individual image points emit at a defined angle alpha(i). Through the eye lens, this image point hits a particular site on the retina. The emission angle alpha determines the point on the retina at which the image point is depicted. By suitable arrangement, it is thus possible to generate one image per eye. By means of two corresponding images, a three-dimensional image can be transmitted to the viewer. The opening angle of the emission cone determines the pixel size on the retina and hence the sharpness of the image.

9. LCs for the Implementation of an Eye Replacement Device

In the case of a very inadequate or missing eye lens, it is possible to directly stimulate a functioning retina with a directed emission matrix. For this purpose, the emission matrix is applied very close to or directly to the retina, and the directed emission is fed directly to the individual light receptors on the retina. The image source can be generated externally by a camera or a mini-camera in the eye. A synthetic eye apparatus has thus been established. In the case of a poorly functioning retina, this process can be used to increase the light source intensity, such that the receptors respond to the enhanced light stimuli.

10. iLC Device for the Production of Spotlights

The directed emission can also be utilized to establish a spotlight with a defined emission cone angle. In this case, the emission elements should be arranged in parallel, with the same emission cone opening angle.

The invention claimed is:

1. A device for concentrating light, as a luminescence concentrator, or for dispersing light, as a luminescence disperser, consisting of luminescent sites,
    which are formed from donor and acceptor dye molecules in a donar/acceptor ratio greater than 10:1 in supramolecular arrangement and organized in zeolites so as to result in an antenna function, which luminescent sites are referred to as antennas, wherein no dye molecules are present on the outer surface of the zeolites
    which are embedded as one layer, or two or more layers spaced apart, into a polymer, individual dye-zeolite layers having a thickness between 10 nm and 2000 nm,
    and which are on or between transparent sheets which are suitable for total internal reflection and consist of glass, plastic or a combination thereof,
    wherein the thickness of the sheets is of the order of magnitude of one or more of these layers.

2. The device according to claim 1, wherein said device comprises three regions in the sequence specified:
    transparent glass, plastic or a combination thereof with refractive index $n_1$ and sheet thickness $x_1$, on which the light is incident,
    one or more directed dye-zeolite layers which consist of the light-absorbing and light-emitting antennas,
    transparent glass, plastic or a combination thereof with refractive index $n_2$ and sheet thickness $x_2$.

3. The device according to claim 2, wherein
the individual layers immediately adjoin one another or are separated by intermediate layers of a transparent material which are thin relative to the thickness of the sheets;
the refractive indices of the intermediate layers and of the polymer into which the dye-zeolite layers are embedded are selected such that a maximum light yield is ensured.

4. A process for producing a device for concentrating light as a luminescence concentrator or dispersing light as a luminescence disperser according to claim 1, wherein said device is produced by an alternating application, repeatable as often as desired, of transparent glass, plastic or a combination thereof, and one or more dye-zeolite layers under the formation of stacks, the distances between the individual dye-zeolite layers being determined by the thickness of the intermediate layers, and these dye-zeolite layers having different structures as a function of different dye molecules, of the thickness of the dye-zeolite layers and of the relative alignment of the zeolite crystals.

5. Method of use of a device according to claim 1 for concentrating light as a luminescence concentrator, comprising the steps of concentrating the light incident on the surface thereof, both in diffuse and direct form, due to the frequency shift and total internal reflection caused by antennas, and transferring said concentrated light to one, more than one or all side surfaces of the luminescence concentrator.

6. Method of use of a device according to claim 1 for dispersing light as a luminescence disperser, comprising the step of emitting light which is incident on one, more than one or all side surfaces of the luminescence disperser, both in diffuse and direct form, on the surface of the disperser or parts thereof as a result of the frequency shift and total internal reflection caused by antennas.

7. Method of use of a device according to claim 1 as a luminescence concentrator, comprising the step of collecting and concentrating sunlight and feeding it into photovoltaic energy conversion systems.

8. Method of use of a device according to claim 1 as a luminescence concentrator, comprising the step of collecting and concentrating sunlight and feeding it into fiber optics devices.

9. Method of use of a device according to claim 1 as a luminescence concentrator, comprising the step of collecting and concentrating sunlight and feeding it into photovoltaic energy conversion tandem solar cells for increasing the electrical energy yield.

10. Method of use of a device according to claim 1 as a luminescence concentrator, comprising the step of collecting and concentrating sunlight and feeding it into combined photovoltaic hot water devices for the conversion of light to electrical and thermal energy.

11. Method of use of a device according to claim 1 as a luminescence concentrator, comprising the step of collecting electromagnetic or particle radiation and converting it to light, correspondingly to the way scintillation counters work, and transporting it to a luminescence detector.

12. Method of use of a device as claimed in claim 1 as a luminescence disperser, comprising the step of applying said device for signaling systems, illuminated signage, room lighting, flat/diffuse light sources and background illumination.

13. Method of use of a device as claimed in claim 1 as a luminescence disperser, comprising the step of obtaining locally directed emission for three-dimensional imaging in ophthalmology.

* * * * *